United States Patent [19]
Gleckman

[11] Patent Number: 5,684,354
[45] Date of Patent: *Nov. 4, 1997

[54] BACKLIGHTING APPARATUS FOR UNIFORMLY ILLUMINATING A DISPLAY PANEL

[75] Inventor: Philip L. Gleckman, Irvine, Calif.

[73] Assignee: Tir Technologies, Inc., Hawthorne, Calif.

[*] Notice: The term of this patent shall not extend beyond the expiration date of Pat. No. 5,440,197.

[21] Appl. No.: 317,209

[22] Filed: Oct. 3, 1994

Related U.S. Application Data

[63] Continuation-in-part of Ser. No. 131,659, Oct. 5, 1993, Pat. No. 5,440,197.

[51] Int. Cl.⁶ .................................. G02F 1/133
[52] U.S. Cl. ............................... 313/110; 359/49
[58] Field of Search ................. 313/110; 359/48–50, 359/40, 42; 362/19, 26, 257

[56] References Cited

U.S. PATENT DOCUMENTS

| | | | |
|---|---|---|---|
| Re. 33,987 | 7/1992 | Suzawa | 359/49 |
| 1,734,834 | 6/1929 | Steward et al. | 362/293 |
| 2,761,056 | 8/1956 | Lazo | 240/2.1 |
| 2,907,869 | 10/1959 | Hudson et al. | 240/2.1 |
| 3,223,833 | 12/1965 | Protzmann | 362/26 |
| 3,349,234 | 10/1967 | Schwarz | 240/2.1 |
| 3,586,851 | 6/1971 | Rudolph | 240/47 |
| 3,957,351 | 5/1976 | Stockwell | 350/160 LC |
| 4,011,001 | 3/1977 | Moriya | 350/160 LC |
| 4,043,636 | 8/1977 | Eberhardt et al. | 350/160 LC |
| 4,118,110 | 10/1978 | Saurer et al. | 350/334 |
| 4,183,628 | 1/1980 | Laesser et al. | 350/338 |
| 4,195,915 | 4/1980 | Lichty et al. | 350/345 |
| 4,212,048 | 7/1980 | Castleberry | 362/19 |
| 4,252,416 | 2/1981 | Jaccard | 350/345 |
| 4,440,474 | 4/1984 | Trcka | 350/345 |
| 4,453,200 | 6/1984 | Trcka et al. | 362/31 |
| 4,528,617 | 7/1985 | Blackington | 362/32 |
| 4,560,264 | 12/1985 | Kitazawa et al. | 354/219 |
| 4,616,295 | 10/1986 | Jewell et al. | 362/31 |
| 4,649,462 | 3/1987 | Dobrowolski et al. | 362/2 |
| 4,706,173 | 11/1987 | Hamada et al. | 362/341 |
| 4,720,706 | 1/1988 | Stine | 340/783 |
| 4,723,840 | 2/1988 | Humbert et al. | 350/345 |
| 4,735,495 | 4/1988 | Henkes | 350/345 |
| 4,737,896 | 4/1988 | Mochizuki et al. | 362/301 |
| 4,766,526 | 8/1988 | Morimoto et al. | 362/255 |
| 4,798,448 | 1/1989 | Van Raalte | 350/345 |
| 4,914,553 | 4/1990 | Hamada et al. | 362/32 |
| 4,945,349 | 7/1990 | Sanai | 340/784 |
| 4,998,804 | 3/1991 | Horiuchi | 350/334 |
| 5,029,045 | 7/1991 | Sanai et al. | 362/26 |
| 5,029,986 | 7/1991 | De Vaan | 350/338 |
| 5,050,946 | 9/1991 | Hathaway et al. | 385/33 |
| 5,161,041 | 11/1992 | Abileah et al. | 359/40 |
| 5,202,950 | 4/1993 | Arego et al. | 385/146 |
| 5,440,197 | 8/1995 | Gleckman | 313/110 |

*Primary Examiner*—Edward L. Coles, Sr.
*Assistant Examiner*—Stephen Brinich
*Attorney, Agent, or Firm*—Knobbe, Martens, Olson & Bear, LLP

[57] ABSTRACT

A light source for backlighting a display panel comprises a light-emitting device such as an incandescent light bulb or LED array disposed within a cavity having diffusely reflecting walls and an aperture. A diffuser and brightness enhancing film are situated at the opening of the aperture between the aperture and the display to be backlit. Preferably, light emerging from the aperture is substantially uniform in intensity and color, and in one embodiment, a color filter is employed to whiten the light emerging from the aperture. One embodiment has an aperture in which the ratio of the area of the aperture to the sum of such area and the surface area of the cavity is at least 0.05. In this embodiment, the ratio of the depth of the cavity to an edge to edge dimension of the cavity is at least 0.1.

17 Claims, 6 Drawing Sheets

BACKLIGHTING APPARATUS FOR UNIFORMLY ILLUMINATING A DISPLAY PANEL

BACKGROUND OF THE INVENTION

This application is a continuation in part of application Ser. No. 08/131,659, filed Oct. 5, 1993, now U.S. Pat. No. 5,440,197.

The present invention relates to a backlighting apparatus for displays, particularly for small-area liquid-crystal displays (LCDs), such as utilized in virtual reality headsets. LCDs, which allow the display of alphanumeric, graphic or other information, may comprise a medium whose transmittance changes in response to the application of an electrical potential across the medium. The LCDs may be viewed even in an otherwise dark environment by applying illumination uniformly to their rear face. An exemplary backlighting apparatus for an LCD is disclosed in U.S. Pat. No. 4,043,636.

It is desirable for a backlight for small-area LCDs, such as those found in helmets of virtual reality systems, to have certain attributes. Firstly, it must have an acceptable level of brightness. Secondly, it is preferable to have a spectral distribution that is as white as possible, particularly if the LCDs display color images. The light source must be compact, and preferably require little maintenance. Lastly and most importantly, the lighting system must provide uniform illumination across the entire area of the display. This latter need translates into a requirement that the light emerging from the light source be featureless and free of distortions such as holes or rings. In practice, the requirement of uniform illumination is difficult to achieve, and prior art devices frequently fail to provide a sufficiently uniform source of illumination for LCD displays. Additionally, prior art devices frequently relied on light guides to direct light to reflective surfaces, necessitating complicated geometries and added weight and expense.

An object of the present invention is therefore to provide a simple, compact, lightweight means for backlighting a display, typically a small-area LCD display, which provides highly uniform, high-intensity illumination of the entire display panel.

SUMMARY OF THE INVENTION

The light source of the present invention backlights a rear surface of a display panel, and includes a housing having diffusely reflective interior surfaces which form a cavity. A device that emits light, for example, an incandescent light bulb or LED array, is mounted in the cavity with the interior surfaces of the cavity spaced therefrom. The housing has an aperture juxtaposed with the rear surface of the display panel which opens into the cavity. The ratio of the area of the aperture to the sum of (i) the area of said aperture and (ii) the diffusely reflective surface area of the cavity is at least 0.05 in a preferred embodiment of the present invention. The ratio of the depth of the cavity to an edge to edge dimension of the aperture is at least 0.1. The aperture of the embodiment disclosed also has a bisector dimension, defined as the edge-to-edge length of the aperture along a line formed by the intersection of the plane of the aperture and a plane normal to the plane of the aperture extending through the bulb and bisecting the aperture. The ratio of the depth of the cavity to its bisector dimension is at least 0.1 in a preferred embodiment of the present invention. In one embodiment of the present invention, the depth of the cavity is not substantially greater than the diameter of the envelope of the light bulb.

The light source also comprises a diffuser placed across the aperture and positioned to diffuse illumination which passes through the aperture from the cavity toward the display panel. A brightness enhancing material for passing illumination within a viewing range is disposed between the diffuser and the display panel. In a preferred embodiment having orthogonally oriented brightness enhancing films, the viewing range is 50 degrees. This range is the sum of a pair of angles of 25 degrees measured relative to lines normal to the plane of the aperture.

If desired, a color filter may be included between the cavity and the LCD. In the preferred embodiment, the filter is placed between the brightness enhancing film (BEF) and the rear surface of the display to increase the color temperature of the light incident on the display.

In one embodiment of the present invention, the light bulb is positioned in a portion of the cavity that is outside of a viewing aperture portion, so that the filament is not visible through the aperture within the viewing angle. In another embodiment of the present invention, the light bulb is located within the viewing aperture portion of the cavity beneath the aperture. A baffle in front of the lamp reflects light towards the bottom of the cavity, and prevents the bulb from directly emitting illumination through the aperture, thereby preserving the uniformity of the light emerging from the aperture. In yet another embodiment, the light is produced by an LED array. The LEDS have colors (e.g. red, blue, and green) and intensities which produce, in combination, light that is white in color.

In all embodiments, the emitted light is diffusely reflected within the interior surfaces of the cavity, such that the cavity effectively functions as a lambertian light source. The diffuser gives the transmitted light a more uniform intensity distribution. The brightness enhancing film (BEF) concentrates the light emerging from the diffuser by projecting it into a smaller angular viewing range, and thereby enhances the intensity within the viewing angle. Finally, a color filter, which is typically blue for incandescent light, may be used to change the color temperature of the incandescent light from 2800 K–3300 K to around 4500 K–5500 K, thereby providing a whiter color.

The invention also encompasses a method of backlighting a display panel comprising the step of producing illumination from a substantially lambertian light source having a cavity with internal walls and an aperture. The producing step comprises the step of directing light rays from the perimeter of the aperture into the cavity such that the light exiting the aperture is substantially uniform in intensity and color. The method also includes the steps of using a diffuser to diffuse light from the substantially lambertian light source using a brightness-enhancing film to concentrate the diffused light into a predetermined angular range without significantly reducing the uniformity of the diffused light, and directing the concentrated diffused light onto the display panel.

The backlighting apparatus of the present invention produces illumination of a very uniform character, with relatively high intensity and whiteness, in a device that is both simple and compact.

DESCRIPTION OF THE PREFERRED EMBODIMENTS

Figure 1:
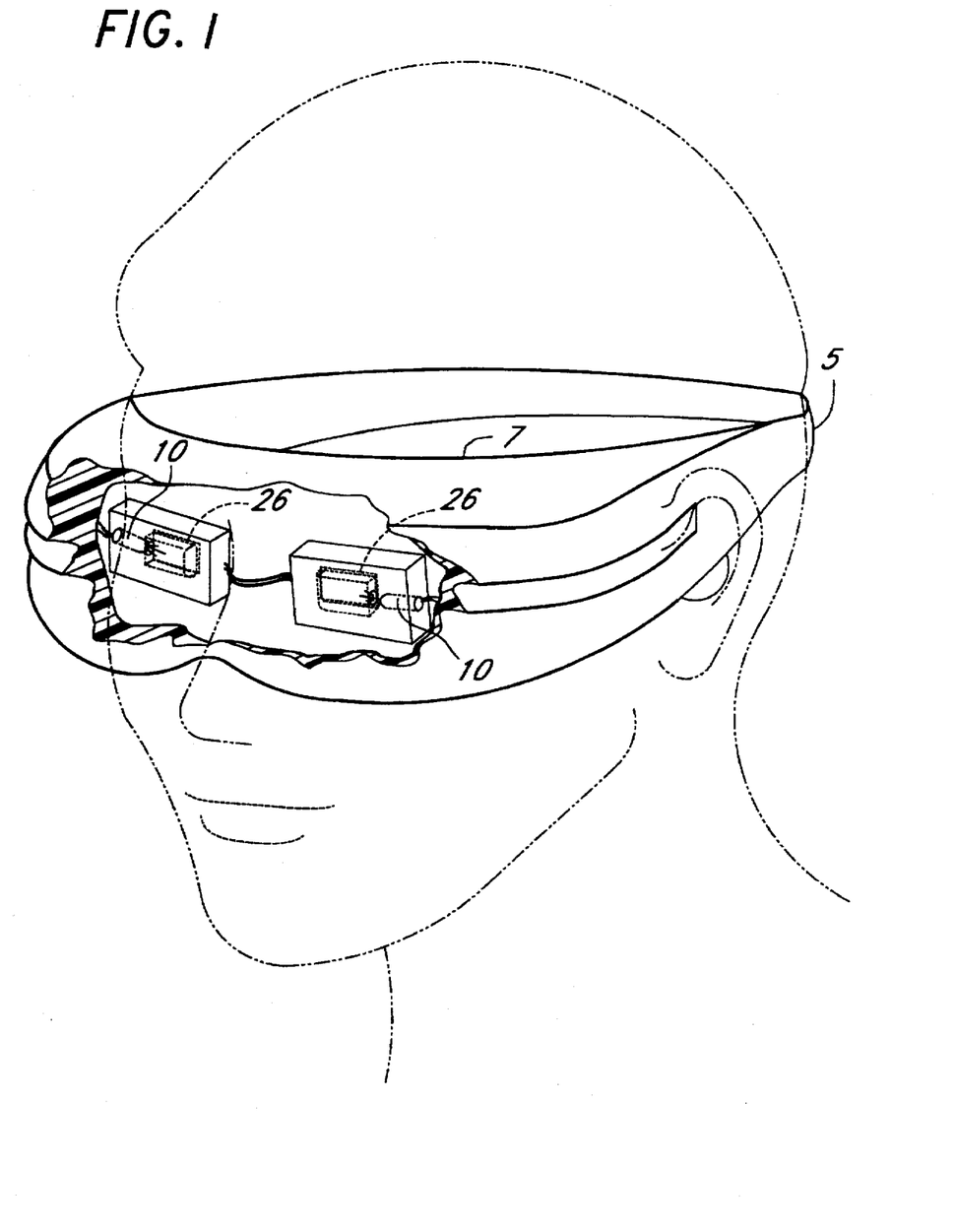
FIG. 1 is a perspective view of a virtual reality headset incorporating an LCD backlit by the light source of the present invention.

As shown in FIG. 1, one preferred embodiment of the present invention comprises a virtual reality headset 5 configured to be worn on the head of a user. The headset 5 has a pair of small-area color display panels 26 disposed within an interior cavity 7 of the headset. Each of the panels 26 comprises an LCD with a front face and a rear face of identical size. Each of the front faces of the panels 26 is positioned behind an eyepiece (not shown) that is directly in front of a respective eye of the user so that each eye views the front face of a single one of the panels. By way of example, each of the faces of the display panels 26 is rectangular, having a length of ½" and a width of ½". The headset is configured to fit against the face of the user sufficiently tightly so that light from ambient sources cannot enter the cavity 7. When properly mounted on the user's head, the headset will always be in substantially the same position relative to the user's face, and the display panels 26 will thus also always be in substantially the same position with respect to the user's eyes. Accordingly, each time the headset is worn, the eye of the viewer will have the same viewing position with respect to the display screens 26.

Figure 2:
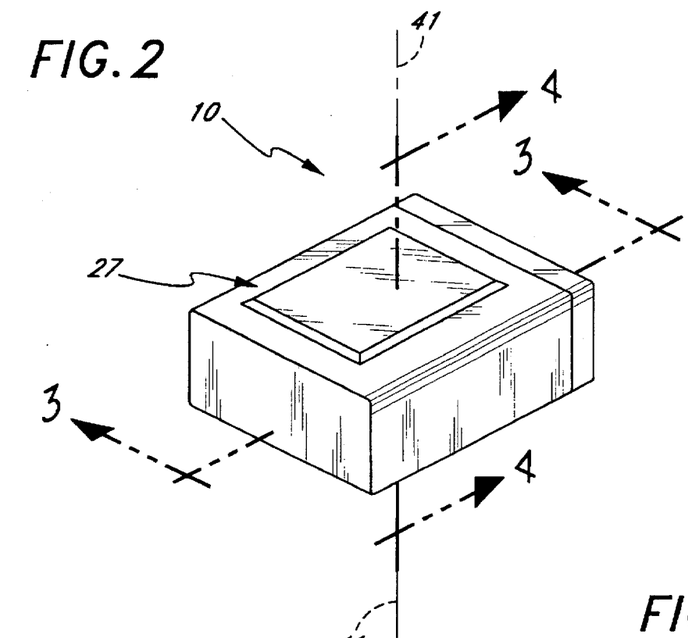
FIG. 2 is a perspective view of an embodiment of the light source of the present invention.
Figures 3, 4:
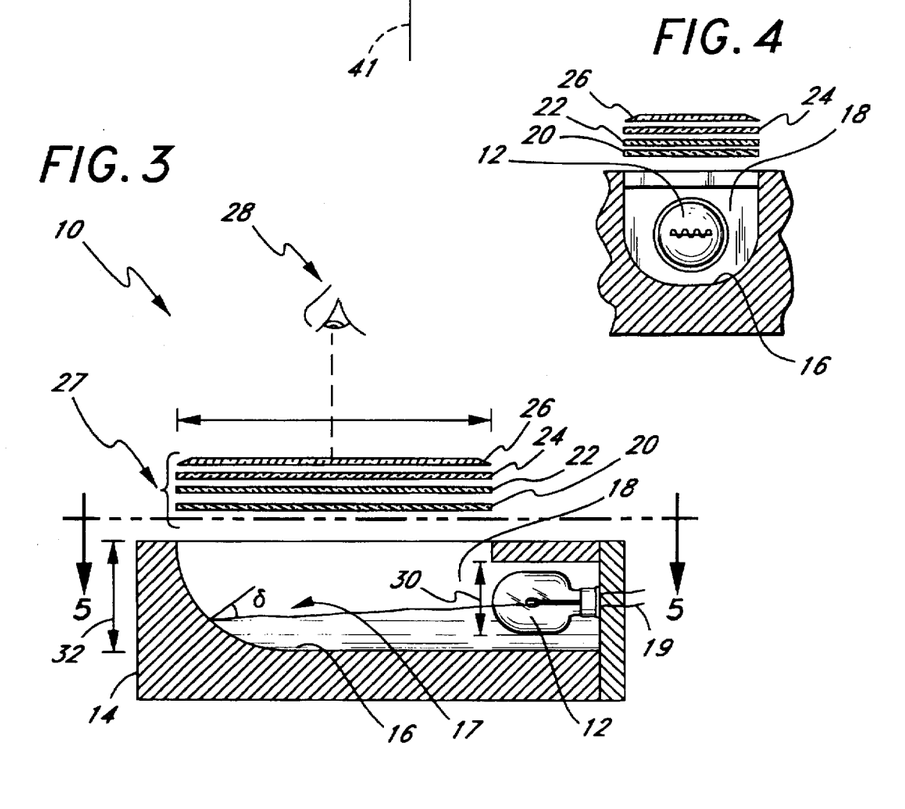
FIG. 3 is a cross-sectional view of the light source of FIG. 2 taken along the lines 3—3 of FIG. 2.
FIG. 4 is an end-on cross-sectional view of the light source of FIG. 2 taken along the lines 4—4 of FIG. 2.

Each of the panels 26 includes a backlighting apparatus 10, as shown in FIGS. 2 and 3. The backlight 10 is comprised of a bulb 12, located within a housing 14 having an aperture 18, covered by a diffuser 20, a brightness enhancing film (BEF) 22, and a color filter 24. The diffuser 20, BEF 22, and color filter 24 are placed in physical contact with each other, forming a planar structure hereinafter referred to as a light quality enhancing (LQE) apparatus 27. The LCD display 26, which is backlit by light emerging through the aperture 18 from cavity surfaces 16, is juxtaposed with the LQE apparatus 27, so that the display 26 may be viewed from a position 28. Although the headset 5 has not been shown in FIG. 2 for clarity of illustration, it will be understood that the position 28 would be within the interior cavity 7 of the headset 5.

In one embodiment of the present invention, the housing 14 has lateral internal dimensions of 13 mm×33 mm, and the thickness or depth of the housing is 10 mm, slightly larger than the diameter of a standard flashlight bulb. The aperture 18 is 13 mm square in this embodiment. The aperture 18 is preferably smaller than 2 inches square to ensure uniform illumination of the cavity walls 16 opposite the aperture 18 by the incandescent bulb 12.

The lamp 12 is preferably an incandescent light bulb such as a common flashlight lamp powered by a power source (not shown) connected to wires 19. The lamp 12 is preferably entirely enclosed in the housing 14 so that only the wires 19 emerge from the housing 14. The wires 19 pass through a small passageway in a wall of the housing 14. The passageway is just large enough to accommodate the wires 19 and is substantially smaller than the diameter of the bulb, thereby minimizing light leakage emanating from the annular space, if present, between the wires and the housing 14.

Light radiating from the lamp 12 propagates within the housing 14, which forms a cavity comprising diffusely reflecting interior surfaces 16 preferably having a reflectivity of at least 88%. The surfaces 16 may be coated with white paint or more exotic materials such as the Labsphere Corporation's Spectraflect paint. Spectraflect paint's reflectivity is considerably higher than house paint, roughly 98%, while the reflectivity of house paint is approximately 92%. Additionally, the housing 14 may be entirely constructed from a diffusely reflecting material, such as $TiO_2$ pigmented Lexan™ polycarbonate or Spectralon™ plastic, thereby avoiding the need to apply a separate coating to the interior surfaces 16 of the housing 14. The reflectivity of Spectralon™ plastic is about 99%.

Light emerging from the lamp 12 typically undergoes several reflections within the cavity formed by the housing 14 before eventually emerging from the aperture 18. Because the interior surfaces 16 of the housing 14 are diffusely reflecting, the multitude of diffuse reflections cause the interior surface of the housing 14 opposite the aperture 18 to be uniformly lit and act as a substantially lambertian source, i.e., a light source having the property that the radiance or brightness of the interior cavity surfaces is constant as a function of viewing angle.

In constructing the light source 10 of the present invention, there are a number of factors to consider. One of these is the area of the aperture 18. Another is the combined cavity area, that is the sum of (i) the surface area of the cavity interior 16 and (ii) the area of the aperture 18. For maximally efficient use of the energy emitted from the bulb 12 and uniformity of the emitted light from the aperture 18, it is important that the ratio of the area of aperture 18 to the combined cavity area be relatively high to ensure minimal energy loss within the light source. Preferably, this ratio is at least 0.05, and in the preferred embodiment the ratio is close to 0.20. Referring to FIG. 4, the side cavity walls 16 are curved; such an arrangement decreases the combined cavity area, and thus increases the aforementioned ratio of the area of the aperture to the combined cavity area. The bottom cavity wall may also be curved as well to decrease the angle δ (shown in FIG. 3) as a function of increasing distance from the bulb. The angle δ is the angle formed between a line drawn from the filament of the bulb 12 and the outward-pointing normal to a plane tangent to the cavity surface at each point.

Figure 5:
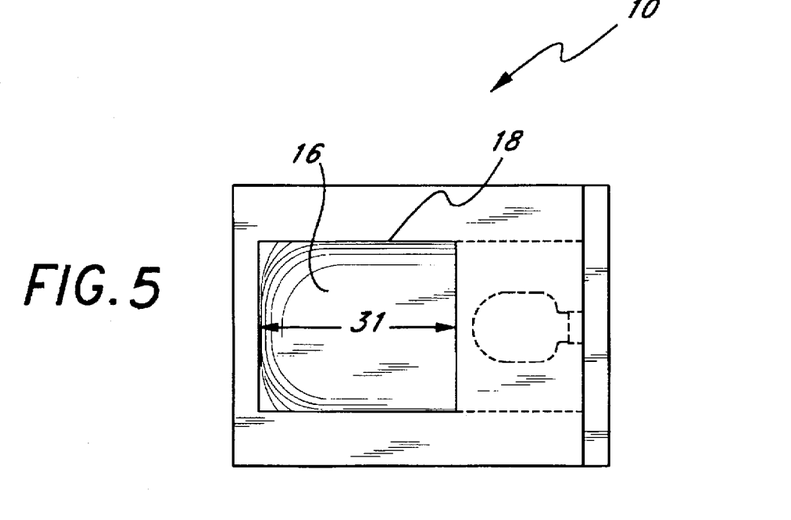
FIG. 5 is a plan view of the light source of FIG. 2 taken along the lines 5—5 of FIG. 3.

Another parameter of importance shown in FIG. 5, is the edge-to-edge dimension 31 of the aperture 18, referred to herein as the bisector dimension. This bisector dimension extends along a line formed by the juncture of the plane of the aperture and a plane normal to the plane 41 of the aperture 18 extending through the bulb 12 and bisecting the aperture. The ratio of the depth of the housing 14 to this bisector dimension affects both the intensity and uniformity of the light visible through the opening of the aperture 18. If this ratio is too large, the aforementioned ratio of the area of the aperture to the combined cavity area becomes too small. With a small ratio, light from bulb 12 will also undergo fewer reflections from the cavity walls 16 and undergo $1/r^2$ fall off, resulting in a less-uniform intensity distribution. In the preferred embodiments of the present invention, the ratio is more than approximately 0.10.

Still another parameter of the present invention is the ratio of the diameter 30 of the envelope of the lamp 12 (typically the width of the bulb) to the depth 32 of the cavity formed by the housing 14. In the preferred embodiment of the present invention, this ratio is sufficiently high to achieve compactness. The housing 14 is preferably constructed so that the depth 32 is not substantially greater than the diameter 30 of the bulb. By way of example, the ratio may be 0.60.

While the housing 14 and the aperture 18 basically function as a source of uniform light intensity even in the absence of the diffuser 20, in the preferred embodiment of present invention the diffuser 20 is advantageously placed in the opening of the aperture 18 to remove residual nonuniformities such as cosmetic imperfections in the interior surfaces 16 of the cavity. The diffuser is comprised of translucent material, typically a readily available thin plastic surface or volume diffuser. Both of these materials are preferred because they are characterized by very low absorption, thus minimizing energy losses.

To avoid wasting optical energy, it is preferable to match the numerical aperture of the backlight with the numerical aperture of the optics (e.g., the eyepiece of the headset 5) that receives the light from the backlight. Because the cavity acts as a substantially lambertian source, it is necessary to decrease the numerical aperture of the backlight, and thereby concentrate the light emanating from the aperture. In particular, the backlight 10 employs the BEF 22 placed between the diffuser 20 and the display 26 to concentrate the illumination, and thereby increases the brightness.

It is helpful for present purposes to define an angle which characterizes the performance of BEF 22. This angle, $\theta_t$ (shown at 39 in FIG. 10), is the semi-angle from a normal 36 to the plane of the aperture 18. More specifically, the BEF 22 transmits light rays within $\theta_t$. Except for weak side lobes, no light will be transmitted by the BEF beyond the angle $\theta_t$.

Figure 10:
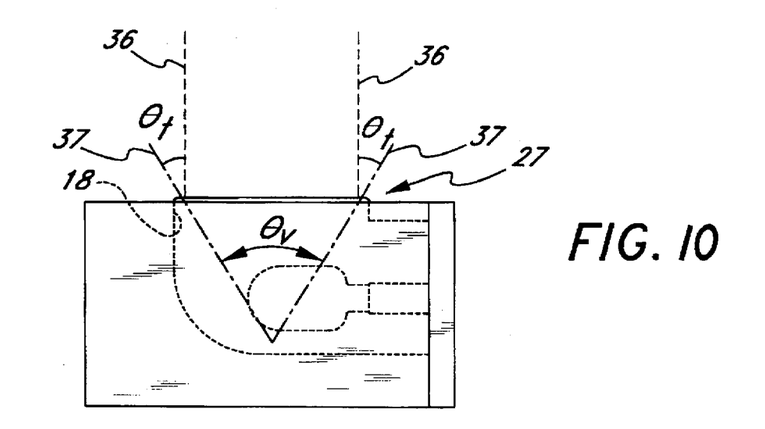
FIG. 10 is an schematic view of the light source showing the viewing angle.

A second angle, the viewing angle $\theta_v$, shown at 41, subtends twice the angle $\theta_t$ of the BEF 22. Consequently, $\theta_v = 2\theta_t$.

It will be understood that concentration of the illumination by the BEF 22 (within the angle $\theta_t$), shown in FIG. 10, is symmetrical only in the sense that concentration occurs within a plane coincident with the plane of the paper in FIG. 10. The BEF 22 does not provide concentration within the orthogonal plane. In some applications of the invention, it is preferable to concentrate the illumination in both of the orthogonal planes. This may be accomplished by including a second BEF oriented orthogonally to the BEF shown in FIG. 10. Such an arrangement would provide a boundary line 37 at each of the four edges of the aperture 18 and thereby concentrate the illumination so that substantially no radiation beyond the angle $\theta_t$ is transmitted from the aperture 18.

Figure 7:
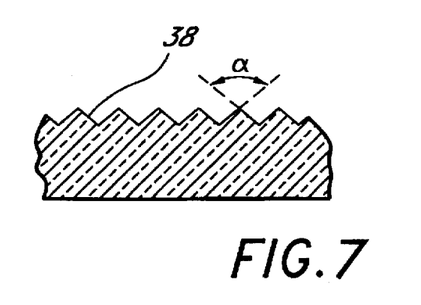
FIG. 7 is a fragmentary view in cross section, of a brightness enhancing film as shown in FIG. 3.

Referring to FIG. 7, the BEF of the preferred embodiment is a commercially available thin film having linear pyramidal structures 38. In principle, the structures 38 transmit only those rays from the cavity that satisfy the incidence angle criteria for transmission into the transmission region bounded by the boundary lines 37. All other rays will be reflected back into the cavity, where they are diffusely reflected again by the cavity walls. In effect, the reflected rays are "recycled" until they are incident on the BEF at an angle which permits them to pass through the BEF into the transmission region.

The fraction f of light retroreflected by the pyramidal structures 38 of the BEF 22 satisfies the relationship $1-f \approx \sin\theta_t$. The brightness-enhancing effect results from the fact that many of the retroreflected rays are themselves diffusely reflected and eventually are transmitted by the BEF 22. Because the BEF 22 is designed so that $\theta_t < 90$ degrees, it concentrates light within the display range, thereby increasing the intensity of light seen within this range. Using pyramidal structures, a 40% gain over an unenhanced lambertian source has been observed. If a film having orthogonally oriented rows is used, a gain of as much as 80% may be possible. The use of orthogonally oriented films produces the enhancing effect in two orthogonal planes rather than only along the axis perpendicular to the pyramidal structures, as is the case when only one set of pyramidal structures 38 is used. In the preferred embodiment, the structure of the film is sufficiently fine that it is imperceptible to the viewer of the display 26 and the light intensity resulting therefrom is as uniform as possible. Referring to FIG. 7, the BEF 22 may be a film having an apex angle $\alpha$ (typically about 100°). Such film is available from 3M. As an alternative to two orthogonally oriented lenticular films of the type shown in FIG. 7, an array of two-dimensional micro lenses may be utilized.

Figure 6:
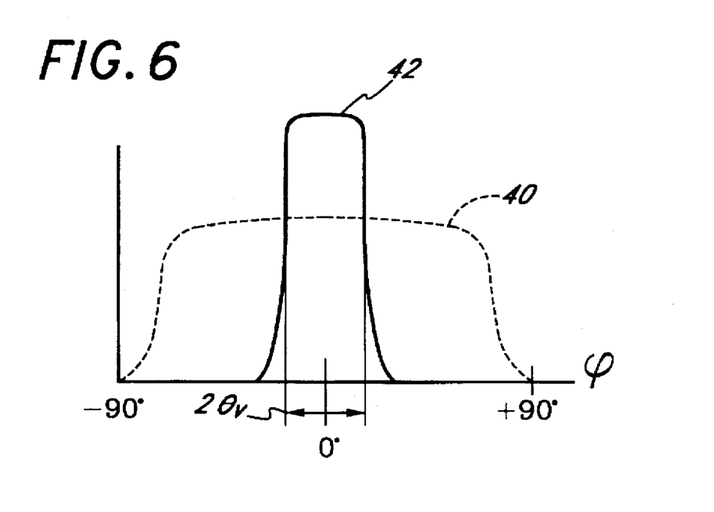
FIG. 6 is a graph showing the intensity of light emitted from the light source shown in FIG. 2 as a function of viewing angle.

The concentrating effect of the BEF 22 is depicted in FIG. 6, which is a graph of the brightness of light observed as a function of viewing angle $\phi$ (here, viewing angle $\phi$ is defined as the angle the eye of the observer makes with the plane of the aperture 18). Graph 40 illustrates the intensity as a function of viewing angle without the BEF 22, while graph 42 shows a distribution achieved with the BEF 22. It can be seen that the intensity achieved within the window $\theta_v = 2\theta_t$ degree wide is greater than that achieved by use of the diffuser alone. It is also important to note that the BEF is placed between the diffuser and the display, since the latter has a spreading effect on the angular distribution of light, while the former concentrates it.

FIG. 6 also illustrates an advantageous feature of the present invention, namely the uniformity of the distribution of illumination throughout the viewing range 60. It can be seen that the graph 42 of the light intensity emerging from the BEF 22 as a function of viewing angle $\phi$ is highly uniform throughout the entire viewing angle $\theta$.

Light emerging from the BEF 22 passes through the color filter 24 in a preferred embodiment of the present invention. The color temperature of the flashlight bulb that comprises the lamp 12 is only about 2800 K. However, color LCD displays require a higher color temperature to achieve ideal color purity. Consequently, when an incandescent source is employed as the lamp 12, a filter may be used to shift the color distribution as desired. The filter 24 of the preferred embodiment is a blue absorbing filter that shifts the color temperature to between about 4500 K and 5500 K. Light passing through the filter 24 continues through the LCD 26 to the eye of the viewer located at the position 28. The gaps between elements 20, 22, and 24 in FIG. 1 are depicted only for clarity; the thicknesses of and separation between each of the various elements are minimized for the sake of compactness.

Figure 8:
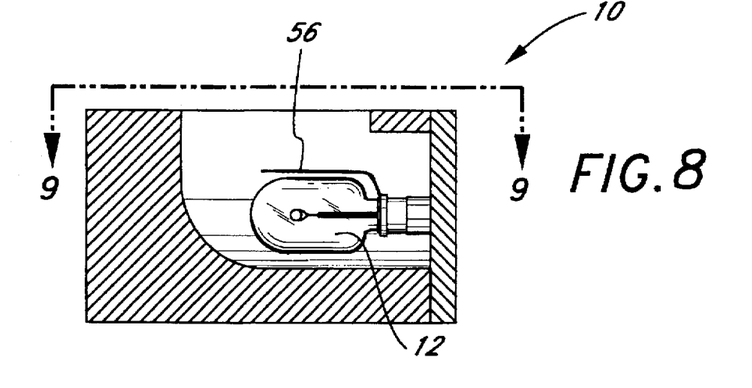
FIG. 8 is a cross sectional view of a second embodiment of the present invention.
Figure 9:
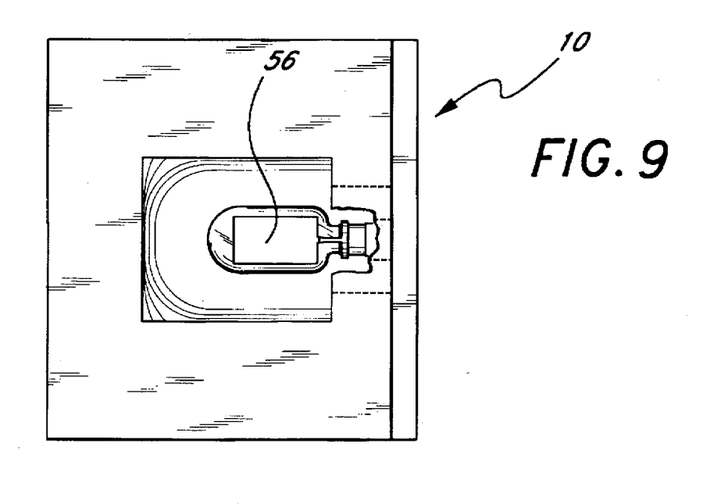
FIG. 9 is a plan view of the embodiment of FIG. 8.

In the embodiment of the backlight illustrated in FIGS. 2–3, the lamp 12 is situated in the housing 14 so that it is outside of a viewing aperture portion 17. As used herein, the term "viewing aperture portion" refers to the portion of the cavity that lies directly beneath the aperture 18. Placement of the lamp 12 outside the viewing aperture portion 17 prevents most of the light rays emanating from the lamp 12 from reaching the aperture 18 without first being reflected off a surface of the cavity. Since only glancing rays from the bulb 12 directly impinge on the LQE 27 and the diffuser 20 scatters these rays, this arrangement allows the intensity distribution of light emerging from the aperture 18 to be relatively uniform. An alternate embodiment of the backlighting system allowing even more compact construction is illustrated in FIGS. 8–9, in which corresponding numbers denote like parts. The lamp 12 is placed in a different portion of the housing 14. In this embodiment, the lamp 12 is placed directly within the viewing aperture portion 17. The lamp 12 is shielded from the aperture 18 by an opaque baffle 56. The baffle 56 has two diffusely reflecting outer surfaces which are coated with one of the diffusely reflecting materials described above. The diffusely reflecting surfaces of the baffle 56 prevent the lamp 12 from directly illuminating the aperture 18, while reflecting light incident thereon, such as any rays reflected back toward the aperture from the diffuser and the BEF, thus preserving the uniformity of the light distribution. Since the lamp 12 is directly beneath the aperture, as opposed to being set back in the housing 14 outside viewing aperture 17, the housing 14 can be more laterally compact than that of the embodiment of FIG. 2. Additionally, the embodiment of FIG. 8 allows a higher ratio of the aperture surface area to the combined cavity area, thus allowing even greater efficiency in the use of energy emanating from the bulb 12. Aside from this placement of the lamp, all details of this embodiment, such as the coating of the interior surfaces of the housing 14 and the placement of the diffuser, BEF and filter, are identical to those of FIG. 2.

Figure 11:
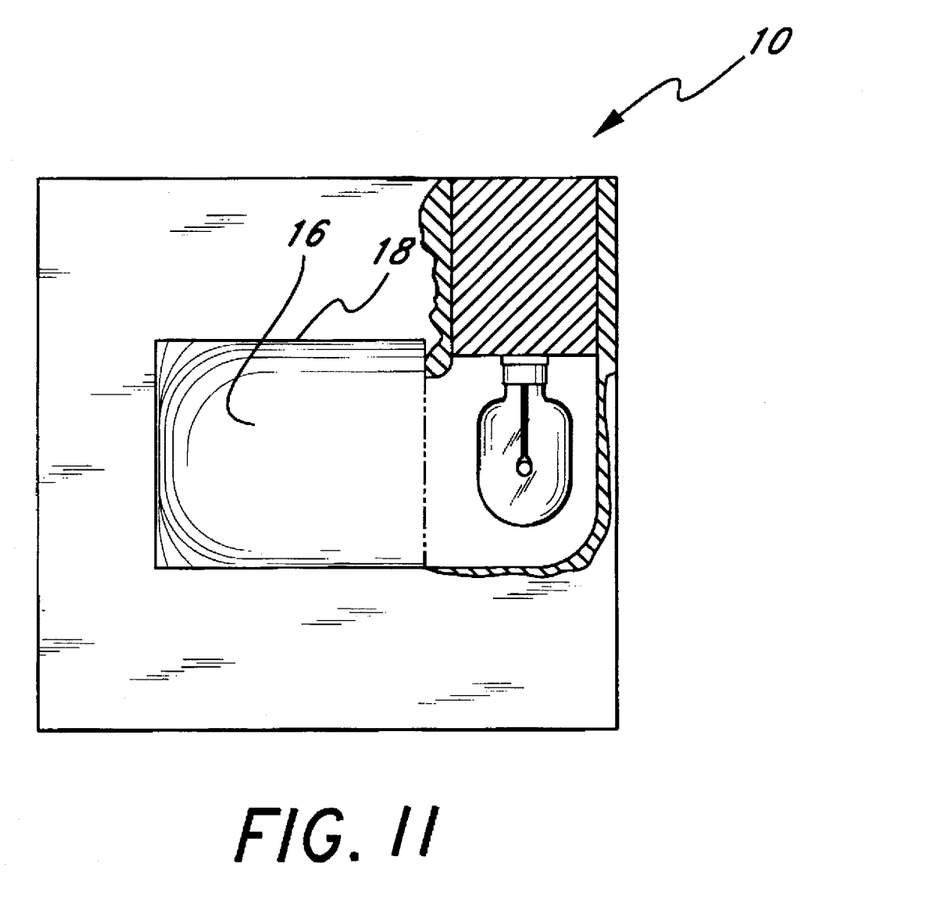
FIG. 11 is a plan view of an alternate embodiment of the light source which is identical in all respects to the embodiment of FIG. 2 except that the light source is mounted transversely to the configuration depicted in FIG. 2.

A further embodiment, illustrated in FIG. 11, is identical to the embodiment shown in FIGS. 1–5, except for the orientation of the bulb 12. Accordingly, like numbers designate like parts. In the embodiment of FIG. 11, the bulb is oriented so that a line extending along its longitudinal axis is parallel to, but spaced from, the aperture (as opposed to the embodiment shown in FIG. 5, where a line extending along the longitudinal axis of the bulb passes beneath the aperture). Thus, the bulb in FIG. 11 is rotated 90° relative to the bulb in FIG. 5.

Figure 12:
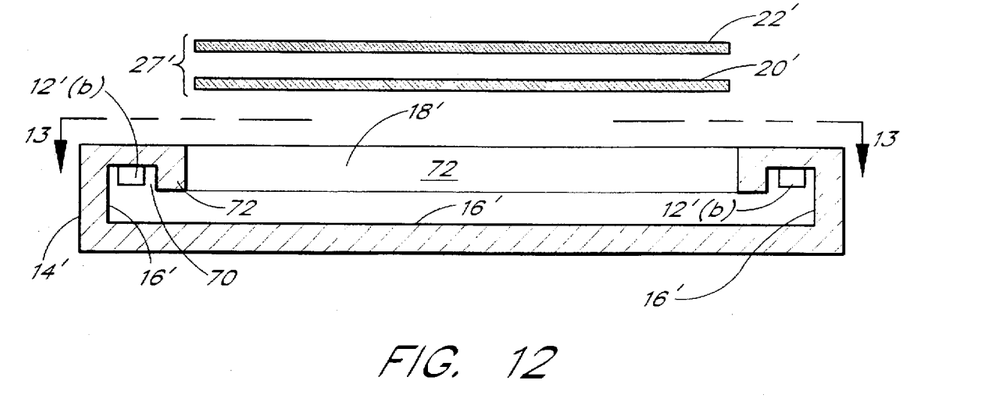
FIG. 12 is a cross-sectional view of an embodiment utilizing an arrangement of red, blue, and green LEDs which in combination produce white light.
Figure 13:
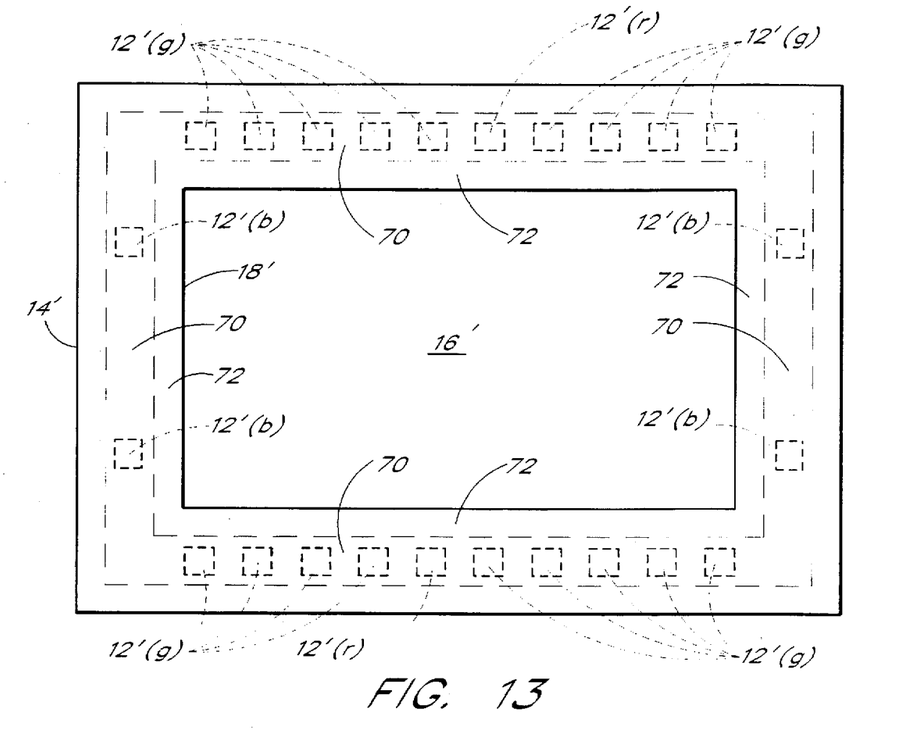
FIG. 13 is a plan view of the light source of FIG. 12 taken along the lines 13—13 of FIG. 12.

Yet another embodiment of a lambertian light source is shown in FIGS. 12 and 13. In this embodiment, red, blue, and green light from light emitting diodes (LED) is mixed together in a manner well known in the art to produce white light. For clarity of illustration, parts corresponding to like parts of prior embodiments will be designated using like numbers that are primed. As illustrated, a housing 14' comprises a diffusively reflecting cavity having interior cavity walls 16' and an aperture 18' which opens into the cavity. The dimensions of the aperture 18' are 16.1 mm by 14.1 mm for the particular arrangement shown, which uses 2 red LEDs 12'(r), 4 blue LEDs 12'(b), and 18 green LEDs 12'(g). As shown in FIG. 13, the LEDs are mounted around the periphery of the aperture 18' within a channel 70 that extends around the entire perimeter of the aperture 18'. The channel 70 is formed by a small baffle 72 that extends from the edge of the aperture 18 a short distance into the cavity and along the entire perimeter of the aperture 18'. Preferably, the distance by which the baffle 72 extends into the cavity is no greater than is necessary to prevent the LEDs from being viewed through the aperture 18'. In any event, the baffle 72 is spaced from the cavity walls 16 by a sufficient distance to permit light from the LED's to diffusively reflect into the portion of the cavity beneath the aperture 18'. In preferred embodiments, the depth of the cavity is 5–10 mm. As is typical of light-emitting diodes, the LEDs 12' comprise tiny cubes of solid-state material that emit light. In the embodiment shown, the solid-state material is not encased in a housing, and no directional reflectors are used such that the emission is allowed to propagate multidirectionally from plural faces of the solid-state cubes. Such multifaceted emission enhances the uniformity of the intensity of light exiting the aperture 18'.

The LEDs 12' are positioned so that for each color (red, blue, green) the output from the aperture 18' is substantially uniform with respect to intensity. In the preferred embodiment, the LEDs 12' are positioned symmetrically, with an equal number of diodes 12' of like color on opposite edges of the rectangular aperture 18'. Thus, as viewed from FIG. 13, the top edge of the aperture 18' has nine green diodes 12'(g) and one red diode 12' (r), while the bottom edge of the aperture also has nine green diodes 12'(g) and one red diode 12'(r). Similarly, the left edge of the aperture has two blue diodes 12'(b), while the right edge also has two blue diodes 12'(b). In addition to symmetry with respect to opposite edges of the aperture 18', the diodes preferably have substantial symmetry with respect to sides of the same edge of the aperture 18'. Thus, for example, the single red diode 12'(r) at the top edge in FIG. 13 is placed substantially in the center of that top edge with five green diodes 12'(g) on the left side and four green diodes 12'(g) on the right side. The bottom edge embodies the same symmetry except that the four green diodes are on the left side of the red diode and the five green diodes are on the right side. In regard to the left aperture edge (as seen in FIG. 13), each of the two blue diodes 12'(b) is positioned so that it is the same distance from an end of the left aperture edge as it is from the other blue diode. The blue diodes 12'(b) at the right aperture edge have this same symmetry with respect to the right aperture edge.

As mentioned above, the combination of LEDs 12' is selected to provide white light. Thus, while a diffuser 20' and BEF 22' are included, as shown in FIG. 12, no color filter is necessary because the combination of red, blue and green colors produces light of sufficient whiteness. However, in some cases it may be necessary to underdrive some of the LEDs in order to obtain the desired color balance and desired whiteness. If so, it is preferable that all LED's of the same color be underdriven by the same amount so as to preserve color uniformity at the aperture 18'. Because the illumination produced by the symmetrical arrangement of LEDs and the diffusively reflecting cavity yields a substantially uniform intensity output at the aperture 18' for each color, the light source produces a high-quality color image.

The present invention thus comprises a highly uniform, efficient, and compact light source for demanding applications such as small color LCD displays in virtual reality systems. However, it also has application in other small-area backlighting systems as well, such as in digital watches or automotive gauges. It is understood that the present disclosure of the preferred embodiment may be changed in the combination and arrangement of parts without departing from the spirit and scope of the invention hereinafter claimed.

What is claimed is:

1. An apparatus comprising:
   a display panel having a rear surface and a front surface, said display panel being at least partially transmissive such that at least a portion of illumination on said rear surface is transmitted to said front surface;

a light source for backlighting said display panel, said light source comprising:

a device that emits light;

a housing having diffusive reflective interior surfaces forming a cavity, said cavity having a depth, said light emitting device mounted in said cavity, said housing having an aperture which opens into said cavity, said aperture juxtaposed with said rear surface of said display panel to illuminate said rear surface, said cavity having a diffusive reflective surface area and said aperture having an area, the ratio of said area of said aperture to the sum of (i) said area of said aperture and (ii) said surface area of said cavity being at least 0.05, said aperture having an edge to edge dimension, the ratio of said depth to said edge-to-edge dimension being at least 0.1;

a diffuser at said aperture, said diffuser positioned to diffuse illumination which passes through said aperture from said cavity toward said display panel;

a brightness enhancing material disposed between said diffuser and said display panel, said material concentrating illumination within a viewing angle so as to enhance the brightness of the display panel.

2. The apparatus of claim 1, wherein said light emitting device comprises an incandescent light bulb.

3. The apparatus of claim 2, wherein said apparatus additionally comprises a color filter having characteristics selected to increase the whiteness of light from said incandescent bulb, whereby said color temperature is above 4,000° K.

4. The apparatus of claim 2, wherein said incandescent bulb has a filament enclosed by an envelope, and wherein the ratio of the depth of said housing to the diameter of said envelope enclosed by said filament is less than 1.8.

5. The apparatus of claim 2, wherein said incandescent bulb has a filament enclosed by an envelope, and wherein the depth of said housing is not substantially greater than the diameter of said envelope enclosed by said filament.

6. The apparatus of claim 1, wherein the interior surfaces of said cavity are coated with white paint having a reflectance higher than 88 percent.

7. The apparatus of claim 1, wherein the reflective interior surfaces of said housing further comprise high-reflectance plastic.

8. The apparatus of claim 3, wherein the color filter is disposed between said cavity and said display panel.

9. The apparatus of claim 1, wherein said brightness enhancing material comprises a film of linear pyramidal structures.

10. The apparatus of claim 9, wherein said viewing angle is no more than about 35 degrees.

11. The apparatus of claim 9, wherein said brightness enhancing material further comprises a second film of linear pyramidal structures disposed in a direction orthogonal to said film of linear pyramidal structures.

12. The apparatus of claim 2, wherein said incandescent bulb is disposed within said cavity outside of a viewing aperture portion of said cavity.

13. The apparatus of claim 1, wherein the ratio of said depth to said dimension is at least 0.2.

14. The apparatus of claim 2, wherein said incandescent bulb is disposed within a viewing aperture portion of said cavity and wherein said housing further comprises a baffle positioned between the bulb and said aperture.

15. The apparatus of claim 1, wherein said aperture is rectangular, and wherein none of the sides of said aperture exceeds 2 inches in length.

16. A method of backlighting a display panel, comprising:

producing illumination from a substantially lambertian light source comprising a cavity with internal walls and an aperture, said step of producing illumination comprising the step of directing light rays from the perimeter of the aperture into the cavity such that the light exiting the aperture is substantially uniform in intensity and color;

using a diffuser to diffuse light from said substantially lambertian light source;

using a brightness enhancing film to concentrate the diffused light into a predetermined angular range without significantly reducing the uniformity of the diffused light; and directing the concentrated, diffused light onto said display panel.

17. The method of claim 16, further comprising the step of using a color filter to increase the color temperature of said concentrated, diffused light to a value above approximately 4,000° K.

* * * * *